(12) United States Patent
Tyson

(10) Patent No.: US 7,498,837 B1
(45) Date of Patent: Mar. 3, 2009

(54) FUNCTIONAL PRE-CONFIGURATION OF A PROGRAMMABLE LOGIC DEVICE

(75) Inventor: James M. Tyson, Slough (GB)

(73) Assignee: Altera Corporation, San Jose, CA (US)

( * ) Notice: Subject to any disclaimer, the term of this patent is extended or adjusted under 35 U.S.C. 154(b) by 131 days.

(21) Appl. No.: 11/347,469

(22) Filed: Feb. 3, 2006

Related U.S. Application Data

(63) Continuation of application No. 10/654,518, filed on Sep. 2, 2003, now Pat. No. 7,030,646.

(51) Int. Cl.
*H03K 19/173* (2006.01)

(52) U.S. Cl. .......................................... 326/38; 326/47

(58) Field of Classification Search ............. 326/37–41, 326/47; 716/16
See application file for complete search history.

(56) References Cited

U.S. PATENT DOCUMENTS

| | | | |
|---|---|---|---|
| 5,640,107 A | 6/1997 | Kruse | |
| 6,732,263 B1 * | 5/2004 | May et al. ....................... | 713/1 |
| 6,738,962 B1 | 5/2004 | Flaherty et al. | |
| 6,828,823 B1 | 12/2004 | Tsui et al. | |
| 6,851,047 B1 | 2/2005 | Fox et al. | |
| 6,924,663 B2 * | 8/2005 | Masui et al. ................... | 326/38 |

OTHER PUBLICATIONS

Altera Corporation, 8 page document entitled, "Apex II, The Complete I/O Solution", Jul. 2002, Copyright 2002, http://www.altera.com/literature/br/br_ap2.pdf.
Altera Corporation, 2 page document entitled Quartus II Design Version 3.0 Software Overview, May 30, 2003(?), http://www.altera.com/literature/wp/wp-qii_backgrounder.pdf.
Altera Corporation, 2 page document entitled "HardCopy Stratix Overview", Jun. 11, 2003 (?), http://www.altera.com/literature/wp/wp-hst_backgrounder.pdf.
Altera Corporation, 58 page document entitled, "ASIC to FPGA Design Methodology & Guidelines", Jul. 2003, Version 1.0, Application Note 311, AN-311-1.0, Copyright 2003. http://www.altera.com/literature/an/an311.pdf.
Altera Corporation, 8 page document entitled, "Hardcopy Series, ASIC Gain Without the Pain", Jan. 2005, Copyright 2005, http://www.altera.com/literature/br/br_hardcopy.pdf.

* cited by examiner

*Primary Examiner*—James H Cho
(74) *Attorney, Agent, or Firm*—Weaver Austin Villeneuve & Sampson LLP

(57) ABSTRACT

Pre-configuration of a programmable device permits implementation and operation of the device using a first, dedicated operation usable upon power up of the programmable device without the need for programming the device using external configuration data. Configuration data can be provided in any suitable manner to re-configure the device to perform a second, programmable operation. The pre-configured design preferably uses programmable resources and leaves dedicated resources undisturbed during both first and second operations.

19 Claims, 7 Drawing Sheets

FUNCTIONAL PRE-CONFIGURATION OF A PROGRAMMABLE LOGIC DEVICE

CROSS-REFERENCE TO RELATED APPLICATIONS

This application is a continuation of U.S. patent application Ser. No. 10/654,518, filed Sep. 2, 2003 now U.S. Pat. No. 7,030,646, titled FUNCTIONAL PRE-CONFIGURATION OF A PROGRAMMABLE LOGIC DEVICE, which is incorporated herein by reference in its entirety and for all purposes.

BACKGROUND OF THE INVENTION

1. Field of the Invention

This invention relates generally to digital signal processing and specifically to the pre-configuration of programmable or otherwise configurable devices, including programmable logic devices.

2. Description of Related Art

A programmable logic device ("PLD") is a programmable integrated circuit (IC) that allows the user of the circuit, using software control, to program the PLD to perform particular logic functions. A wide variety of these devices are manufactured by Altera Corporation of San Jose, Calif. For the purpose of this description, it is to be understood that a programmable logic device refers to once programmable as well as re-programmable devices. When an integrated circuit manufacturer has supplied a typical programmable logic device, it has not been capable of performing any specific function until after it has been configured by a user. FIG. 1A shows a typical PLD 100 having dedicated resources 104 and programmable resources 102.

Therefore, a user, in conjunction with software supplied by the manufacturer or created by the user or an affiliated source, programs the PLD to perform a particular function or a plurality of functions required by the user's application. FIG. 1B shows configuration data 106, such as a bitstream, that can be sent to the PLD 100 to program and/or configure the PLD 100 to perform one or more desired functions, typically in connection with and using the dedicated resources 104. As seen in FIG. 1B, the configuration data 106 is distributed to programmable registers that act as configuration RAM (CRAM) units 108 to configure the functionality of logic elements, embedded memory modes, I/O buffer states, etc. 110 in the PLD 100. CRAM also controls the connectivity of the logic elements, all of which is well known to those skilled in the art. The output of CRAM 108 typically is a bit that is used to configure the configurable component 110 of the PLD 100. Once a logic device such as a PLD is programmed with one or more of such cores, as well as any other logic as needed, the PLD can function in a larger system designed by the user just as though dedicated logic chips were employed. However, on power up, each CRAM 108 is in an undefined state (or, for example, all bits are negated) and the PLD 100 is inoperable.

IC manufacturers such as Altera also provide users with the ability to convert programmable configurations into "hard logic" devices. For example, Altera's HardCopy$^{SM}$ program is a seamless migration path from large PLDs to low-cost volume production devices. System architects and design engineers can leverage the functionality, flexibility and time-to-market advantages of PLDs and continue on to low-cost volume production with a HardCopy device, avoiding the financial risk and long development times associated with ASICs. A HardCopy device offers users high-density PLD designs and is designed specifically for the user by migrating the configuration file into a mask-programmed logic device. HardCopy devices typically use the same process technology as their equivalent PLD, offer the features of high-density PLD products, and come in the same packages as the PLDs. A HardCopy device architecture is based on an area-efficient "sea-of-logic-elements" core. However, once a design is converted to the HardCopy device, that device is limited to performing the mask-defined functions. In other words, users lose the ability to program the device.

Techniques that permit users to use one or more functions without requiring programming of a PLD, while still allowing configuration data to program the PLD at a later time, would represent a significant advancement in the art.

BRIEF SUMMARY OF THE INVENTION

The present invention is a pre-configured programmable device system that permits implementation and operation using a first, dedicated operation usable upon power up of the programmable device without the need for programming the device using external configuration data. Such configuration data can be provided in any suitable manner to re-configure the device to perform a second, programmable operation.

More specifically, the programmable device of the present invention allows operation of the programmable device in a first, dedicated operation (or multiple dedicated operations) on power up using programmable resources and, preferably, at other times, without disturbing dedicated resources. The first, dedicated operation can be replaced with a second, programmable operation by re-configuring the programmable device's programmable resources using configuration data such as a configuration bitstream. A dedicated operation can be pre-configured on the programmable device in any suitable way, such as by implementing a selectable metal layer in the device to perform the dedicated operation. A dedicated operation can utilize dedicated resources of the programmable device such as one or more processors and/or memory. Both the dedicated operation(s) and the programmable operation(s) can be implemented so that the dedicated resources are not disturbed by configuring the device to override a dedicated operation and permit use of a programmable operation.

In some embodiments of the present invention, multiple dedicated operations can be pre-configured onto the programmable device for use on power up without the need for configuring the programmable device first. In such cases, a control signal can be used to select which pre-configured dedicated operation is operational upon power up.

Methods of the present invention include pre-configuring the programmable device to perform as a configuration engine to download configuration data and implement a second operation. The programmable device also may use a pre-configured design to implement a processor and Ethernet MAC upon power up so that configuration data can be downloaded from a network. In some embodiments of the present invention, a user can switch between one or more dedicated operations and one or more programmable operations.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which.

DETAILED DESCRIPTION OF THE INVENTION

The following detailed description of the invention will refer to one or more embodiments of the invention, but is not limited to such embodiments. The detailed description is intended only to be illustrative. Those skilled in the art will readily appreciate that the detailed description given herein with respect to the Figures is provided for explanatory purposes as the invention extends beyond these embodiments. For example, the present invention is described in connection with a programmable device such as a PLD or field programmable gate array (FPGA). However, the present invention can be used in connection with any programmable device that permits pre-configuration (for example, by providing a metal layer or other means to implement a switchably selectable dedicated function or operation) and re-configuration by a configuration bitstream or otherwise. Consequently, the present invention is not limited solely to the embodiments discussed and shown herein. Moreover, the present invention may be incorporated into and used with other hardware and software and with other devices.

The present invention allows operation of a programmable device in a first, dedicated operation (or multiple dedicated operations) on power up and, preferably, at other times, without disturbing dedicated resources. The first, dedicated operation can be replaced with a second, programmable operation by re-configuring the programmable device using configuration data such as a configuration bitstream. A dedicated operation can be pre-configured on the programmable device in any suitable way. For example, a device may be pre-configured by tying the default state high or low in the logic design of the base die. Moreover, the device may be pre-configured by implementing a selectable metal layer in the device to perform the dedicated operation. Such a metal layer may make it easier and cheaper to produce different variants from the base die. Other techniques for pre-configuring a device in accordance with the present invention will be apparent to those skilled in the art.

A dedicated operation can utilize dedicated resources of the programmable device such as one or more processors and/or memory. Both the dedicated operation(s) and the programmable operation(s) can be implemented so that the dedicated resources are not disturbed by configuring the device to override a dedicated operation and permit use of a programmable operation. In some embodiments of the present invention, multiple dedicated operations can be pre-configured onto the programmable device for use on power up without the need for configuring the programmable device first. In such cases, a control signal can be used to select which pre-configured dedicated operation is operational upon power up.

Figure 1A:
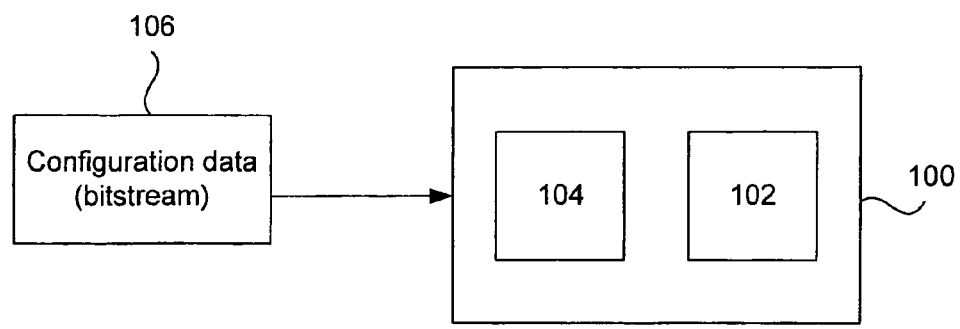
FIG. 1A is a block diagram of a programmable device of the prior art.
Figure 1B:
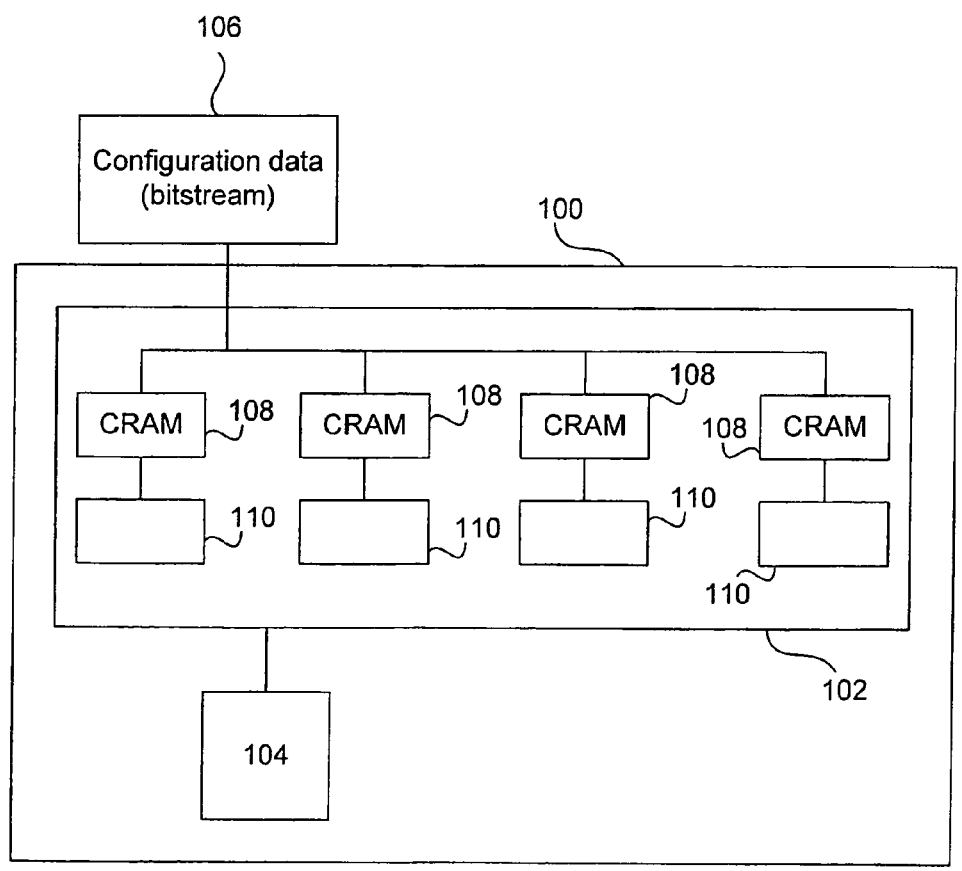
FIG. 1B is a diagram of the programmable device of FIG. 1 showing the use of CRAM in programming configurable components.
Figure 2:
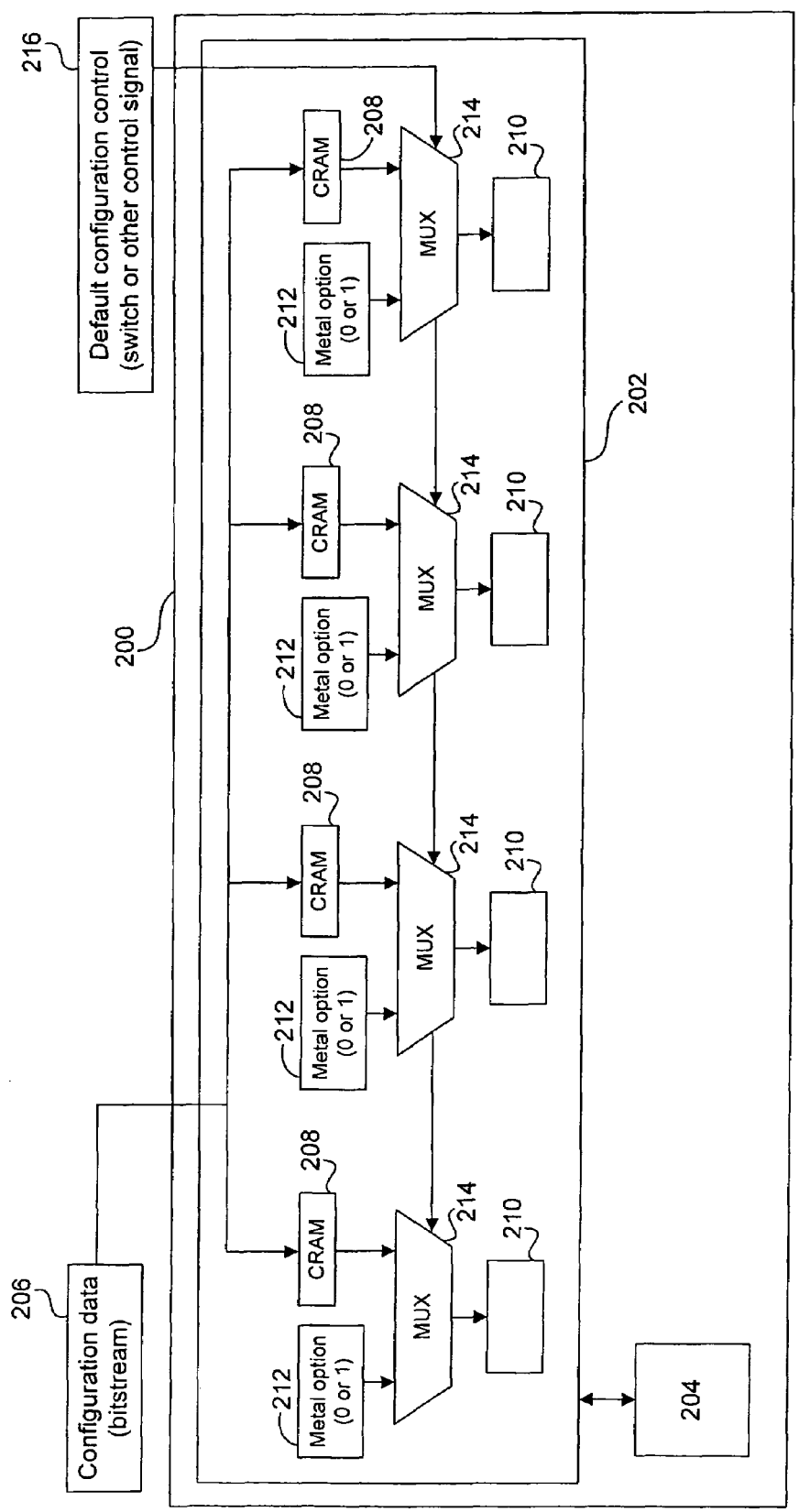
FIG. 2 is a diagram of a programmable device implementing one embodiment of the present invention.

As is well known in the art, configuration data sets CRAM bits to the appropriate levels to provide a programmed operation. Using the present invention, a PLD or other programmable device can be functionally operable on power up, before the programmable device and its CRAM is programmed. FIG. 2 illustrates one embodiment of the present invention, showing a programmable device 200 having dedicated resources 204 and programmable resources 202. The programmable resources 202 of the programmable device 200 include a number of configurable components 210 (only 4 are shown for illustrative purposes, though many programmable devices will comprise many more), which again can include any part of a programmable device that can be configured during programming (for example, logic elements, embedded memory modes, I/O buffer states, etc.).

There is CRAM 208 associated with each configurable component 210. However, unlike earlier systems, the output of the CRAM 208 is not input directly into the configurable components 210. Instead, a selector, such as multiplexer 214, is interposed between each CRAM 208 and component 210. A metal option (or other pre-configuration alternative) 212 is another input of each multiplexer 214. The metal option output, like the CRAM output, typically uses a single bit to configure a given configurable component 210 of the programmable device 200. A user configuration control 216 controls operation of the selectors 214 in any suitable way, which will be apparent to those skilled in the art. Therefore, the output of each selector 214 can be either the programmable CRAM level or a pre-configured 0 or 1, as shown in FIG. 2. Those skilled in the art will appreciate that other structures can achieve the same operational and logic purposes of the embodiment of the present invention shown in FIG. 2.

On reset or power up of the programmable device 200, each multiplexer 214 can be controlled so a fixed level is propagated. In this way, all configurable components 210 (or a selected subset) of the device can be set to a fixed state. By selectively forcing some control bits to 0 and some to 1, the programmable device 200 is effectively configured and can perform one or more functional operations without the need for configuring using the configuration data 206 until desired. At any time, normal device configuration can program the CRAM states. Using control 216, the programmable device 200 can change from the pre-configured state to the programmed state. In one embodiment of the present invention, a user also can switch back to a dedicated operation at any time.

Designs that can be mapped to the programmable device using normal configuration data programming can be used for the programmable operation. For example, using Altera's Quartus utility, the output from Quartus that normally gives CRAM levels would instead yield the metal option. The same base die could therefore be used in many different ways just by changing metal layers.

As will be appreciated by those skilled in the art, the programmable operation can be used to provide functionality before the user's design (that is, the configuration data) is loaded into the programmable device 200. Therefore, using the present invention, PLD resources (for example, I/O, RAMs) can be used by an embedded macro (for example, an Altera Excalibur MPU) before device configuration. Once the PLD is configured, the PLD resources can either remain available for the embedded macro, or be reallocated for use by the user design, depending on what the user wants. Thus, the present invention can be a powerful option for a method of embedding processors within the PLD fabric without any supporting logic. The supporting logic (for example, flash interface, etc.) could be mapped as a default configuration within a PLD, enabling the processor to boot and run prior to full/partial PLD configuration.

With reference to devices and features offered by Altera, a part could be produced that has a hard logic implementation of a NIOS processor core, but no dedicated hard logic peripherals. Device pre-configuration would give the NIOS access to on-chip memory (by routing signals from the processor to the RAM and selecting the mode of operation of the RAM). Other soft peripherals that might be needed by the core to operate before configuration (for example, access to external memory for program code) could also be provided. The NIOS processor would then be able to control device configuration or provide a default system that is reconfigurable.

Figure 3:
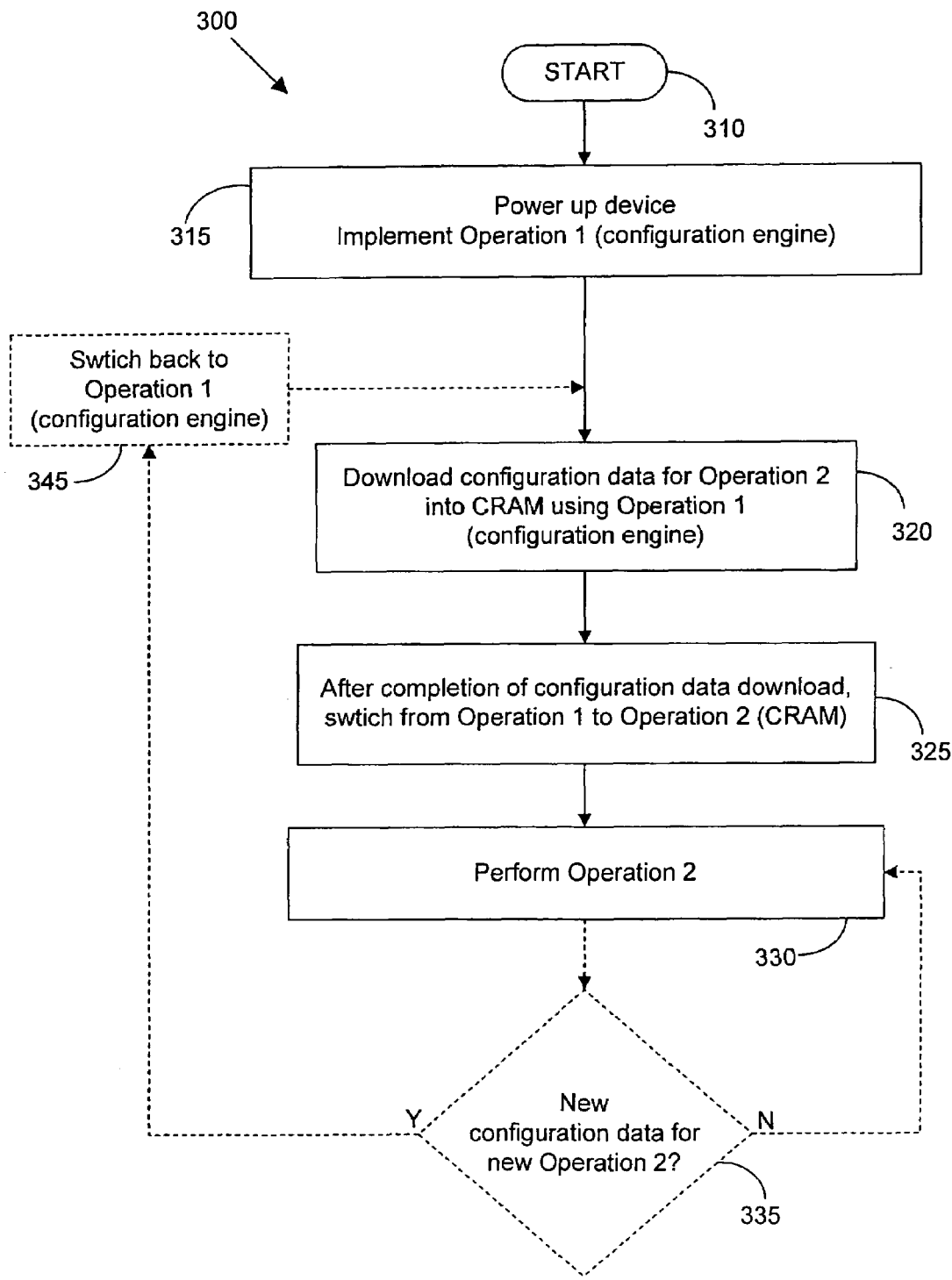
FIG. 3 is a flow diagram of a method embodiment of the present invention.

Using the present invention, PLD resources can be used before configuration of the programmable device to implement a dedicated operation, which can remain or be replaced with something new, depending on what a user wants. According to one embodiment of the present invention, shown in FIG. 3, a programmable device configuration engine can be built using PLD resources, rather than using dedicated logic. Once the configuration data has been loaded, each selector switches over to the CRAM output and the configuration engine is replaced by the user's design. This uses programmable resources for only as long as necessary for operation of the configuration engine on the programmable device and does not remain on the device (using space and/or other resources) any longer than necessary to configure the programmable device. Turning to FIG. 3, the method 300 starts at 310 and upon device power up at 315, the dedicated operation (Operation 1, a configuration engine) is implemented on the device. At 320 configuration data for the programmable operation (Operation 2) is downloaded into the device CRAM. After the configuration data is loaded, operation of the device is switched from Operation 1 to Operation 2 at 325. The device then performs Operation 2 at 330. In one embodiment of the present invention, if new configuration data is available at 335 for a new programmable operation (that is, a new Operation 2), then the device switches back to Operation 1 (the configuration engine) at 345 and begins downloading the new configuration data at 320. If no new configuration data is available at 335, the device continues to perform Operation 2 at 330.

Figure 4:
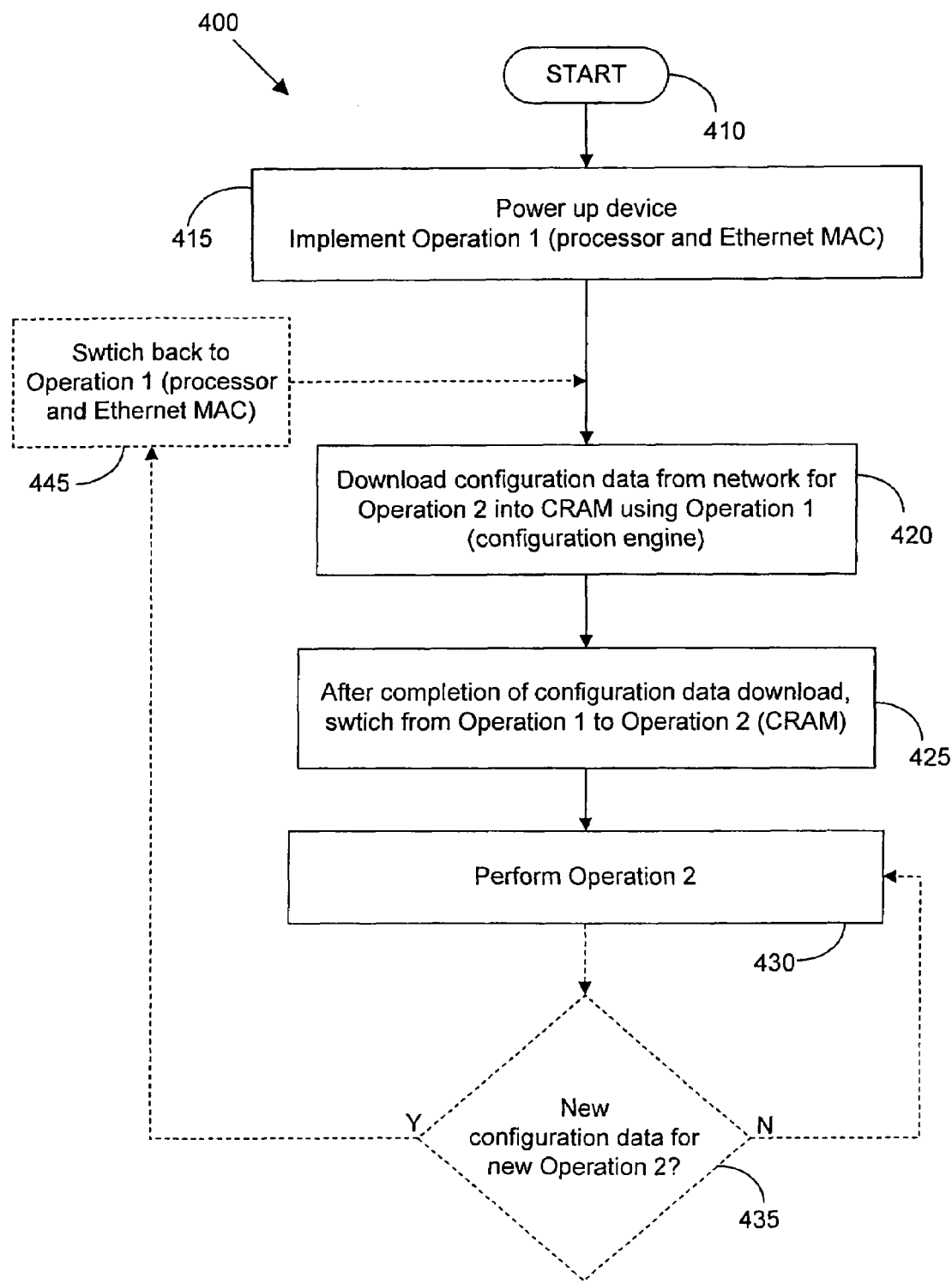
FIG. 4 is a flow diagram of a different method embodiment of the present invention.

In another embodiment of the present invention, shown in FIG. 4, the dedicated operation can be more complex, for example a processor and Ethernet MAC. The programmable device can then configure itself over a network without any dedicated logic. In FIG. 4, the method 400 starts at 410 and upon device power up at 415, the dedicated operation (Operation 1, a processor and Ethernet MAC that allow the device to download configuration data over a network) is implemented on the device. At 420 configuration data for the programmable operation (Operation 2) is downloaded from a network into the device CRAM. After the configuration data is loaded, operation of the device is switched from Operation 1 to Operation 2 at 425. The device then performs Operation 2 at 430. In one embodiment of the present invention, if new configuration data is available on the network at 435 for a different programmable operation (that is, a new Operation 2), then the device switches back to Operation 1 (the configuration engine) at 445 and begins downloading the new configuration data from the network at 420. If no new configuration data is available at 435, the device continues to perform Operation 2 at 430.

In yet a different embodiment of the present invention, a hard macro instantiated in the device requires use of the programmable resources before configuration has been performed (for example, embedded processor access to a PLD embedded memory). By making the programmable design work in the required way by default, there is no need to provide dedicated circuitry or perform a configuration to get an operational system.

Figure 5:
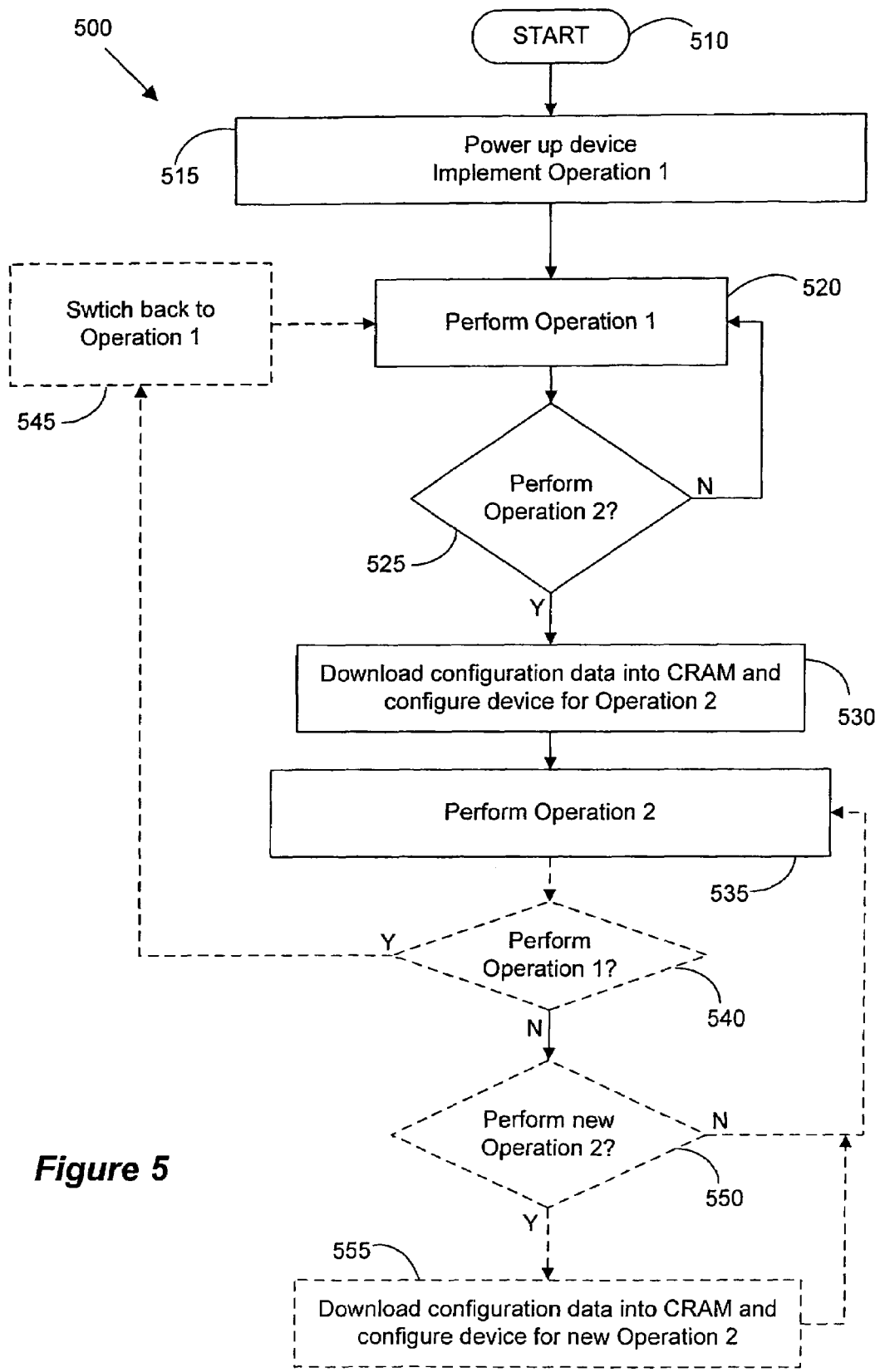
FIG. 5 is a flow diagram of yet a different method embodiment of the present invention.

In one other embodiment of the present invention, shown in FIG. 5, an application can be pre-configured in the programmable device (effectively making it a reconfigurable application specific integrated circuit, or ASIC). The subsequent configuration of the device can then partially or completely override this functionality as required by the system (for example, where the programmable device is pre-configured as a processor system with various external interfaces, sufficient for it to boot and reconfigure itself into the required mode of operation). In FIG. 5, the method 500 starts at 510 and upon device power up at 515, the dedicated operation (Operation 1) is implemented on the device. At 420 the device performs Operation 1 (for example, like an ASIC). At 525 a decision is checked as to whether Operation 2 should be performed. If not, Operation 1 continues at 520. If Operation 2 is to be started, then the configuration data for Operation 2 is downloaded and the device configured with that configuration data at 530. The device then performs Operation 2 at 535.

In some embodiments of the present invention, the operational mode of the device is again checked at 540 to determine whether Operation 1 should be performed. If it is, then the device switches back to Operation 1 at 545 and performs Operation 1 at 520. If not, then another check may be made at 550 to determine whether a new Operation 2 should be performed. If not, then the device continues to perform the configured Operation 2 at 535. If a new Operation 2 is to be performed, then the configuration data for the new Operation 2 is downloaded and the device configured at 555. The device then performs the new Operation 2 at 535.

Generally, embodiments of the present invention employ various processes involving data stored in or transferred through one or more computer systems. Embodiments of the present invention also relate to a hardware device or other apparatus for performing these operations. This apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. A particular structure for a variety of these machines will be apparent to those of ordinary skill in the art based on the description given below.

Embodiments of the present invention as described above employ various process steps involving data stored in computer systems. These steps are those requiring physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, bitstreams, data signals, values, elements, variables, characters, data structures, or the like. It should be remembered, however, that all of these and similar terms are to be associated with the appropriate physical quantities and are merely convenient labels applied to these quantities.

Further, the manipulations performed are often referred to in terms such as identifying, fitting, or comparing. In any of the operations described herein that form part of the present invention these operations are machine operations. Useful machines for performing the operations of embodiments of the present invention include general purpose digital computers or other similar devices. In all cases, there should be borne in mind the distinction between the method of operations in operating a computer and the method of computation itself. Embodiments of the present invention relate to method steps for operating a computer in processing electrical or other physical signals to generate other desired physical signals.

Embodiments of the present invention also relate to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 6:
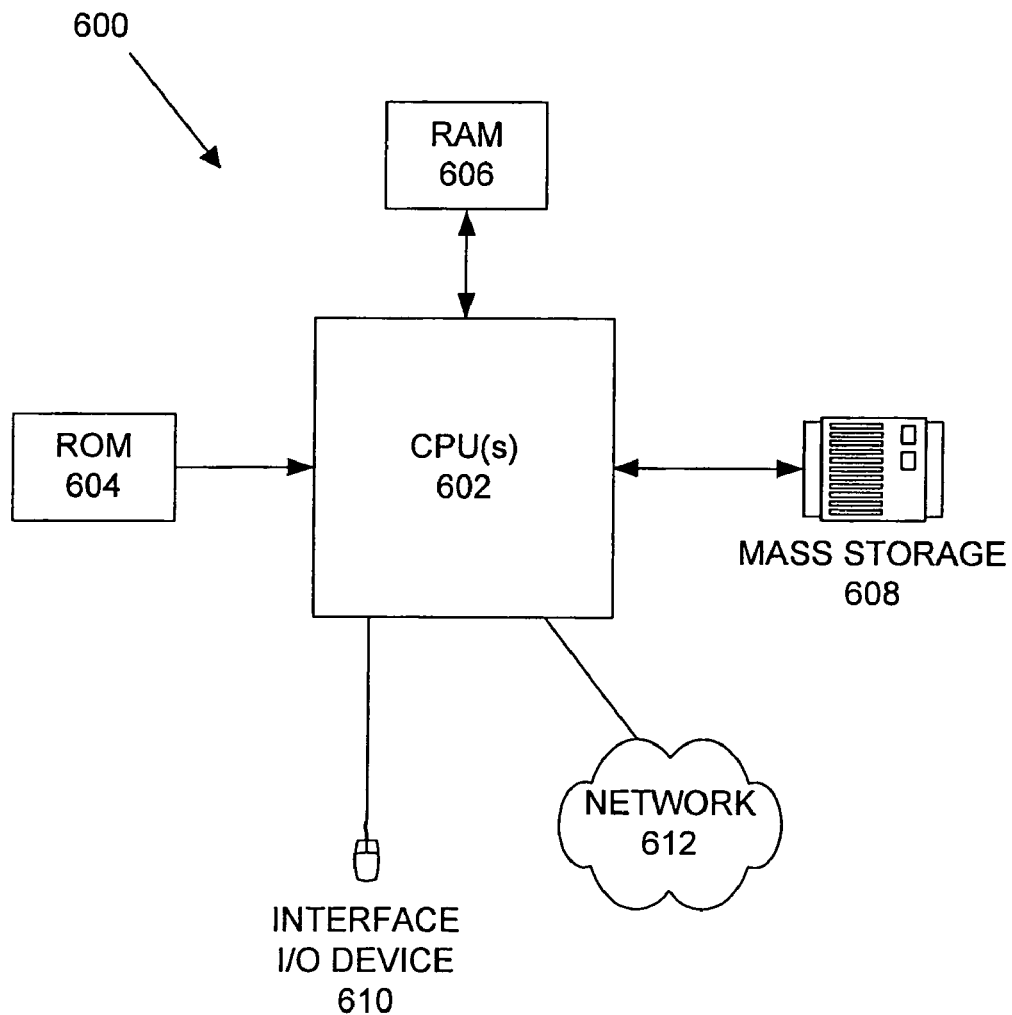
FIG. 6 is a block diagram of a typical computer system suitable for implementing an embodiment of the present invention.

FIG. 6 illustrates a typical computer system that can be used by a user and/or controller in accordance with one or more embodiments of the present invention. The computer system 600 includes any number of processors 602 (also referred to as central processing units, or CPUs) that are coupled to storage devices including primary storage 606 (typically a random access memory, or RAM), primary storage 604 (typically a read only memory, or ROM). As is well known in the art, primary storage 604 acts to transfer data and instructions uni-directionally to the CPU and primary storage 606 is used typically to transfer data and instructions in a bi-directional manner. Both of these primary storage devices may include any suitable of the computer-readable media described above. A mass storage device 608 also is coupled bi-directionally to CPU 602 and provides additional data storage capacity and may include any of the computer-readable media described above. The mass storage device 608 may be used to store programs, data and the like and is typically a secondary storage medium such as a hard disk that is slower than primary storage. It will be appreciated that the information retained within the mass storage device 608, may, in appropriate cases, be incorporated in standard fashion as part of primary storage 606 as virtual memory. A specific mass storage device such as a CD-ROM 614 may also pass data uni-directionally to the CPU.

CPU 602 also is coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 602 optionally may be coupled to a computer or telecommunications network using a network connection as shown generally at 612. With such a network connection, it is contemplated that the CPU might receive information from the network, or might output information to the network in the course of performing the above-described method steps. The above-described devices and materials will be familiar to those of skill in the computer hardware and software arts.

The interconnect structure and overall architecture of the Altera FLEX 10K family of PLDs and other PLD products may be found in other publications from Altera Corporation of San Jose, Calif. Briefly, in the FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ASICs that can benefit from application of the present invention.

Figure 7:
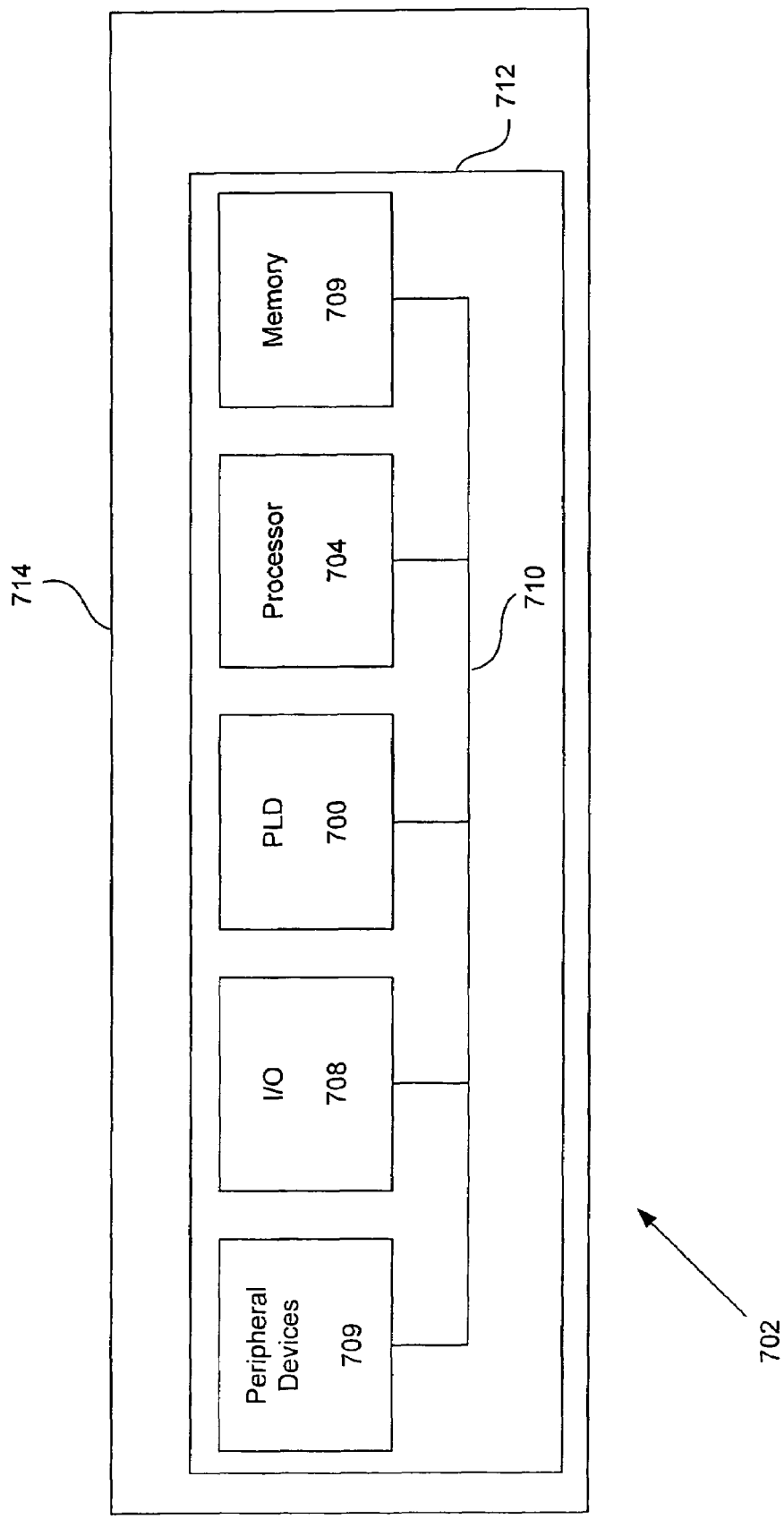
FIG. 7 is a block diagram depicting a system containing a programmable device using one embodiment of the present invention.

This invention also relates to programmable logic devices programmed with a design prepared in accordance with the above described methods. The invention further relates to systems employing such programmable logic devices. FIG. 7 illustrates a PLD 700 of the present invention in a data processing system 702. The data processing system 702 may include one or more of the following components: a processor 704; memory 706; I/O circuitry 708; and peripheral devices 709. These components are coupled together by a system bus 710 and are populated on a circuit board 712 which is contained in an end-user system 714.

The system 702 can be used in a wide variety of applications, such as computer networking, data networking, instrumentation, video processing, digital signal processing, or any other application where the advantage of using re-programmable logic is desirable. The PLD 700 can be used to perform a variety of different logic functions.

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation as illustrated and described. Therefore, the described embodiments should be taken as illustrative and not restrictive, and the invention should not be limited to the details given herein but should be defined by the following claims and their full scope of equivalents, whether foreseeable or unforeseeable now or in the future.

What is claimed is:

1. A programmable device, comprising:
  a pre-configured design, the pre-configured design including a processor and an Ethernet MAC;
  configuration data; and a selector operable to implement either a first operation using the pre-configured design or a second operation using the configuration data, wherein the first operation is downloading the configuration from a network and configuring the device to perform the second operation.

2. The device of claim 1, further comprising:
programmable resources, wherein the first operation is implemented on the programmable resources.

3. The device of claim 2, wherein the first operation is replaceable by re-configuring the device using configuration data to configure the programmable resources.

4. The device of claim 2, further comprising:
dedicated resources, wherein the dedicated resources is selected from the group consisting of memory, I/O, and a processor.

5. The device of claim 4, wherein the programmable resources is selected from the group consisting of a logic element, an embedded memory mode, and an I/O buffer.

6. The device of claim 4, wherein the programmable resources comprises a configurable component.

7. The device of claim 1, wherein the programmable device is a PLD.

8. The device of claim 1, wherein the pre-configured design is a metal layer in the programmable device.

9. The device of claim 1, wherein the configuration data is stored in a volatile memory.

10. The device of claim 1, wherein the selector is a multiplexer.

11. The device of claim 1, wherein the selector is controllable by a control signal that selects which one of the operations is to be implemented.

12. A method, comprising:
pre-configuring a programmable device with a pre-configured design, wherein the pre-configured design includes a processor and Ethernet MAC;
providing configuration data to the device; and
selecting to implement either a first operation using the pre-configured design or a second operation using the configuration data, wherein the first operation is downloading the configuration from a network and configuring the device to perform the second operation; and
implementing the corresponding operation on the device based on the selection.

13. The method of claim 12, further comprising:
performing either the first or second operation based on the selection.

14. The method of claim 13, further comprising:
switching either from performing the first operation to performing the second operation or from performing the second operation to performing the first operation.

15. The method of claim 13, wherein the pre-configured design is a configuration engine and further wherein the first operation is downloading the configuration data and configuring the device to perform the second operation.

16. The method of claim 13, wherein pre-configuring the device comprises providing a metal layer containing the pre-configured design.

17. The method of claim 13, wherein providing configuration data comprises delivering a bitstream to the device.

18. The method of claim 13, wherein the programmable device comprises programmable resources and dedicated resources and further wherein implementing the first operation on the device using the pre-configured design comprises configuring the programmable resources of the device.

19. The method of claim 13, wherein the programmable device comprises programmable resources and dedicated resources and further wherein implementing the second operation on the device using the configuration data comprises configuring the programmable resources of the device.

* * * * *